(12) United States Patent
Kido et al.

(10) Patent No.: US 9,072,177 B2
(45) Date of Patent: Jun. 30, 2015

(54) CONDUCTIVE LAYER INTEGRATED FPC

(75) Inventors: Masayoshi Kido, Shiga (JP); Yoshihide Sekito, Shiga (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 14/233,655

(22) PCT Filed: Jul. 10, 2012

(86) PCT No.: PCT/JP2012/067600
§ 371 (c)(1),
(2), (4) Date: Jan. 17, 2014

(87) PCT Pub. No.: WO2013/011873
PCT Pub. Date: Jan. 24, 2013

(65) Prior Publication Data
US 2014/0158412 A1 Jun. 12, 2014

(30) Foreign Application Priority Data
Jul. 20, 2011 (JP) .................. 2011-159363

(51) Int. Cl.
*H05K 1/00* (2006.01)
*H05K 1/02* (2006.01)
*C08L 63/00* (2006.01)
*H05K 3/28* (2006.01)
*H05K 1/03* (2006.01)

(52) U.S. Cl.
CPC .............. *H05K 1/0218* (2013.01); *C08L 63/00* (2013.01); *H05K 1/0393* (2013.01); *H05K 3/287* (2013.01); *H05K 2201/0715* (2013.01)

(58) Field of Classification Search
USPC .......................................... 174/254; 257/701
See application file for complete search history.

(56) References Cited

U.S. PATENT DOCUMENTS

2006/0214282 A1* 9/2006 Sakata ........................ 257/701
2011/0067904 A1* 3/2011 Aoyama et al. .............. 174/254

FOREIGN PATENT DOCUMENTS

| JP | 2002-012841 | 1/2002 |
| JP | 2003-055583 | 2/2003 |
| JP | 2007-294918 | 11/2007 |
| JP | 2011-071397 | 4/2011 |

OTHER PUBLICATIONS

English translation of International Preliminary Report on Patentability, International Application No. PCT/JP2012/067600, dated Jan. 30, 2014.
English translation of International Search Report, International Application No. PCT/JP2012/067600, dated Oct. 23, 2012.

* cited by examiner

*Primary Examiner* — Andargie M Aychillhum
(74) *Attorney, Agent, or Firm* — Kagan Binder, PLLC

(57) ABSTRACT

A conductive-layer-integrated flexible printed circuit includes: (A) an electromagnetic-shielding conductive layer; (B) a photosensitive resin composition layer; and (C) a wiring-pattern-equipped film, (A) the electromagnetic-shielding conductive layer, (B) the photosensitive resin composition layer, and (C) the a wiring-pattern-equipped film being laminated in this order, and (B) the photosensitive resin composition layer being formed from a photosensitive resin composition containing at least (a) carboxyl-group-containing resin, (b) a photo-polymerization initiator, and (c) thermosetting resin.

5 Claims, 2 Drawing Sheets

F I G. 1
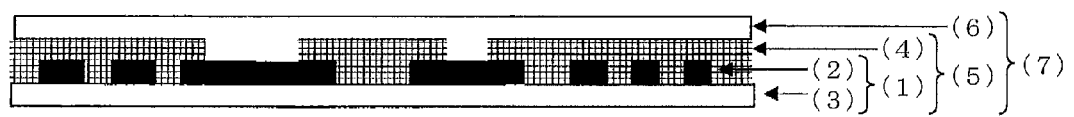
F I G. 2
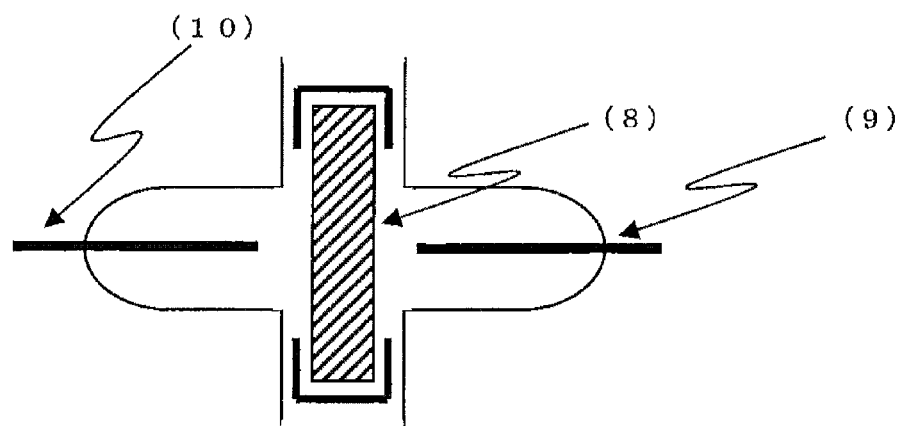

CONDUCTIVE LAYER INTEGRATED FPC

This application claims benefit from International Application No. PCT/JP2012/067600, which was filed on Jul. 10, 2012, which in turn claims priority to Japanese Application No. 2011-159363, which was filed on Jul. 20, 2011, wherein the entireties of said patent applications are incorporated herein by reference.

TECHNICAL FIELD

The present invention relates to a conductive-layer-integrated flexible printed circuit (FPC) on which fine wiring can be formed and which (i) is excellent in flexibility that makes it possible to withstand repeated folding, in flame retardance, and in electrical insulation reliability, (ii) is free from large warpage, and (iii) is excellent in adhesion between an electromagnetic-shielding conductive layer and a photosensitive resin composition layer.

BACKGROUND ART

In recent years, as electronic devices such as mobile phones, video cameras, and notebook computers have rapidly become smaller and smaller in size and lighter and lighter in weight, flexible printed circuit boards (hereinafter referred to as "FPCs") have become indispensable. Meanwhile, as electronic circuits have become narrower in pitch and higher in frequency, it has become more and more important to take measures against electromagnetic noise that is generated from them. Accordingly, an approach has conventionally been made to cause an FPC to constitute an electromagnetic shielding material that blocks or absorbs electromagnetic noise that is generated from an electronic circuit. A known example of the FPC having the electromagnetic shielding function is an FPC which has (i) an insulating layer on top of which a shielding layer having an electrically-conducting adhesive layer, a metal thin-film layer, etc. is joined and (ii) a ground line to which the metal thin-film layer is electrically connected (e.g., see Patent Literature 1).

CITATION LIST

Patent Literature 1

Japanese Patent Application Publication, Tokukai, No. 2009-290103 A (Publication Date: Dec. 10, 2009)

SUMMARY OF INVENTION

Technical Problem

Patent Literature 1, which focuses attention on the electromagnetic shielding material, has as an object to maintain a long-term electromagnetic shielding effect even in the case of repeated bending and/or sliding. However, although the electromagnetic shielding material is an element that constitutes an electromagnetic-shielding-material-integrated FPC, the desired properties of the electromagnetic-shielding-material-integrated FPC cannot be satisfied simply by improving the properties of the electromagnetic shielding material. For example, the electromagnetic-shielding-material-integrated FPC will not exhibit satisfactory properties without an improvement in adhesion between the electromagnetic shielding material and the insulator film of the FPC.

Accordingly, with their attention focused on insulator films of FPCs, the inventors of the present invention diligently studied the adhesion of an insulator film to an electromagnetic shielding material, the flexibility, flame retardance, electrical insulation reliability, and warpage of electromagnetic-shielding-material-integrated FPCs.

Solution to Problem

The inventors of the present invention diligently studied to solve the above problem. As a result, the inventors found that, by employing a conductive-layer-integrated flexible printed circuit board, including: (A) electromagnetic-shielding conductive layer; (B) a photosensitive resin composition layer; and (C) a wiring-pattern-equipped film, (A) the conductive layer, (B) the photosensitive resin composition layer, and (C) the wiring-pattern-equipped film being laminated in this order, and (B) the photosensitive resin composition layer being formed from a photosensitive resin composition containing at least (a) carboxyl-group-containing resin, (b) a photo-polymerization initiator, and (c) thermosetting resin, it is possible to achieve a FPC which on which fine wiring can be formed and which (i) is excellent in flexibility that can withstand repeated folding, in flame retardance, and in electrical insulation reliability, (ii) is free from large warpage, and (iii) is excellent in adhesion between an electromagnetic-shielding conductive layer and a photosensitive resin composition layer.

That is, the conductive-layer-integrated FPC of the present invention includes: (A) an electromagnetic-shielding conductive layer; (B) a photosensitive resin composition layer; and (C) a wiring-pattern-equipped film, (A) the conductive layer, (B) the photosensitive resin composition layer, and (C) the wiring-pattern-equipped film being laminated in this order, and, (B) the photosensitive resin composition layer being formed from a photosensitive resin composition containing at least (a) carboxyl-group-containing resin, (b) a photo-polymerization initiator, and (c) thermosetting resin.

Further, (B) the photosensitive resin composition layer preferably contains (d) fine particles containing at least one element selected from the group consisting of phosphorus, aluminum, and magnesium.

Furthermore, (c) the thermosetting resin preferably has at least one epoxy group, and the number of moles of the epoxy group contained in (c) the thermosetting resin is preferably 1.0 to 3.0 times as many as the number of moles of a carboxyl group of (a) the carboxyl-group-containing resin.

Furthermore, (A) the electromagnetic-shielding conductive layer more preferably contains (e) at least one element selected from the group consisting of silver, copper, aluminum, and nickel.

Advantageous Effects of Invention

As described above, the present invention provides a conductive-layer-integrated flexible printed circuit board, including: (A) electromagnetic-shielding conductive layer; (B) a photosensitive resin composition layer; and (C) a wiring-pattern-equipped film, (A) the conductive layer, (B) the photosensitive resin composition layer, and (C) the wiring-pattern-equipped film being laminated in this order. Because (B) the photosensitive resin composition is formed from a photosensitive resin composition containing at least (a) carboxyl-group-containing resin, (b) a photo-polymerization initiator, and (c) thermosetting resin, fine wiring can be formed on the conductive-layer-integrated FPC, and the conductive-layer-integrated FPC (i) is excellent in flexibility that can withstand repeated folding, in flame retardance, and in electrical insulation reliability, (ii) is free from large warpage,

BRIEF DESCRIPTION OF DRAWINGS

FIG. 1 is a diagram showing a configuration of a conductive-layer-integrated flexible printed circuit board (conductive-layer-integrated FPC).

FIG. 2 is a diagram showing how electromagnetic shielding performance is evaluated according to the KEC method.

DESCRIPTION OF EMBODIMENTS

Figure 3:
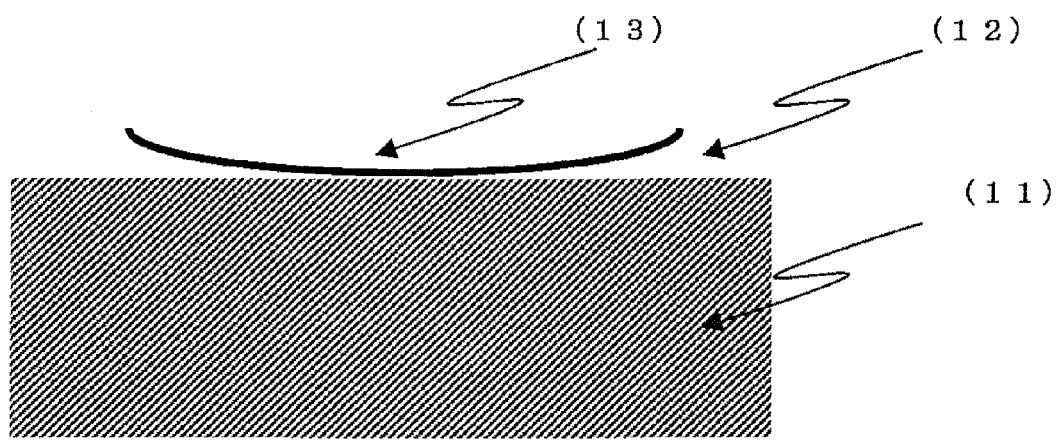
FIG. 3 is a diagram schematically showing how an amount of warpage of a film is measured.

The present invention will be described in detail below. All of those academic documents and patent documents mentioned herein are used as references herein. Note that unless otherwise specified, the range of numerical values "A to B" denotes "not less than A (equal to or more than A) and not greater than B (equal to or less than B)", the symbol "%" denotes "% by mass", and the term "part(s)" denotes "part(s) by mass".

A conductive-layer-integrated FPC of the present invention includes: (A) electromagnetic-shielding conductive layer; (B) a photosensitive resin composition layer; and (C) a wiring-pattern-equipped film, (A) the conductive layer, (B) the photosensitive resin composition layer, and (C) the wiring-pattern-equipped film being laminated in this order, and (B) the photosensitive resin composition layer being formed from a photosensitive resin composition containing at least (a) carboxyl-group-containing resin, (b) a photo-polymerization initiator, and (c) thermosetting resin. The electromagnetic shielding material has been focused on in conventional electromagnetic shielding flexible printed circuit board. As to abrasion resistance and blocking resistance, improvements have been made in view of elasticity. However, in accordance with reduction in size and in weight of electronic devices, FPCs are needed to have finer wiring and higher density. Therefore, there are needed FPCs which can achieve fine wiring and high density and have an electromagnetic shielding function.

However, the inventors of the present invention found that a new problem occurs when an electromagnetic-shielding conductive layer is provided on an insulating layer. Generally, a photosensitive insulating layer needs various properties such as photosensitivity and developability in comparison with a non-photosensitive insulating layer (cover lay film). The photosensitive insulating layer needs to achieve those properties while achieving an electronic insulating property. When an electromagnetic-shielding conductive layer was further provided on a photosensitive insulating layer, the electronic insulating property of the photosensitive insulating layer in a thickness direction was reduced in comparison with the electronic insulating property before the conductive layer was further provided, which is a new problem. Such reduction did not occur in a non-photosensitive cover lay film. The present invention solved the new problem by providing the photosensitive resin composition layer (B) formed from a photosensitive resin composition containing at least carboxyl-group-containing resin (a), photo-polymerization initiator (b), and thermosetting resin (c). The inventors of the present invention further found that adhesion between the photosensitive composition layer and the electromagnetic-shielding conductive layer and the electronic insulating property in the thickness direction were further improved by designing the photosensitive resin composition so that the number of moles of an epoxy group contained in thermosetting resin (c) is 1.0 to 3.0 times as many as the number of moles of a carboxyl group of carboxyl-group-containing resin. Based on the knowledge, the inventors of the present invention presume that fine wiring can be formed on the conductive-layer-integrated FPC of the present invention and the conductive-layer-integrated FPC (i) is excellent in flexibility that can withstand repeated folding, in flame retardance, and in electrical insulation reliability, (ii) is free from large warpage, and (iii) is excellent in adhesion between an electromagnetic-shielding conductive layer and a photosensitive resin composition layer.

The following description will discuss the conductive-layer-integrated FPC of the present invention. The following description will also discuss (A) the electromagnetic-shielding conductive layer, the photosensitive resin composition layer (B), and a wiring-pattern-equipped film (C).

[Conductive-Layer-Integrated FPC]

FIG. 1 is a diagram showing a configuration of a conductive-layer-integrated FPC of the present invention, but the configuration is not limited thereto. First, on or above (C) the wiring-pattern-equipped film (1) composed of a wiring pattern (2) and a base film (3), (B) the photosensitive composition layer (4) is formed, so that an FPC (5) is obtained. Then, (A) the electromagnetic-shielding conductive layer (6) is formed on or above (B) the photosensitive composition layer (4), whereby a conductive-layer-integrated FPC (7) of the present invention can be obtained.

[(A) Electromagnetic-Shielding Conductive Layer]

The electromagnetic-shielding conductive layer (A) of the present invention is an electrically-conducting layer that exhibits an effect of shielding electromagnetic waves at or exceeding 10 dB. In general, the higher a conductive layer is in electric conductivity, the more it is effective in shielding electromagnetic waves. Therefore, the electromagnetic-shielding conductive layer (A) preferably contains a metal that is high in electric conductivity, e.g., at least one type of element (e) selected from the group consisting of silver, copper, aluminum, and nickel.

An example of a method of evaluating the electromagnetic shielding effect of an electromagnetic-shielding conductive layer (A) according to the present invention is, but is not particularly limited to, the KEC method. FIG. 2 is a diagram showing how electromagnetic shielding performance is evaluated according to the KEC method. The KEC method is a method that is carried out by using a jig divided into a receiving antenna (9) and a transmitting antenna (10) between which a measurement sample (8) is placed so that attenuation of signals is evaluated at the receiving antenna. The electromagnetic shielding effect can be calculated according to Formula 1 below:

$$SE(\text{shielding effect}) = 20 \log 10 E_o/E_x [\text{dB}] \quad \text{(Formula 1)},$$

where $E_o$ denotes field intensity of a space in the absence of a shielding material and $E_x$ denotes field intensity of a space in the presence of a shielding material.

Examples of the electromagnetic-shielding conductive layer (A) of the present invention encompass, but are not particularly limited to, (A-1) a film-type electromagnetic-shielding conductive layer, (A-2) a paste-type electromagnetic-shielding conductive layer, (A-3) a metal-thin-film-type electromagnetic-shielding conductive layer, etc. In particular, the film-type electromagnetic-shielding conductive layer is preferable because it can impart shielding properties without impairing the flexibility of the conductive-layer-integrated FPC.

(A-1) Film-Type Electromagnetic-Shielding Conductive Layer

Examples of the film-type electromagnetic-shielding conductive layer of the present invention encompass, but are not particularly limited to, a film obtained by dispersing conductive particles in resin and a multi-layered film including multiple layers such as an electrically-conductive adhesive, a metal thin film, and an insulating layer. Examples of the film obtained by dispersing conductive particles in a resin encompass films manufactured under the trade names of TSS100-18 and TSS100-22 by Toyochem Co., Ltd., etc. Examples of the multi-layered film encompass films manufactured under the trade names of SF-PC5000, SF-PC5100, SF-PC5500, SF-PC5600, SF-PC5900, and SF-PC6000 by Tatsuta Electric Wire 86 Cable Co., Ltd., etc.

An example of a method of forming a film-type electromagnetic-shielding conductive layer on the photosensitive resin composition layer (B) according to the present invention is, but is not particularly limited to, a pressure and heat molding method that involves the use of a thermal press. Conditions for pressure and heat molding by a thermal press encompass, but are not particularly limited to, a thermal-press temperature of 100 to 180° C., a thermal-press pressure of 0.5 kgf/cm$^2$ to 5.0 kgf/cm$^2$, and a thermal-press time of 10 minutes to 90 minutes. Heat and pressure molding under these conditions makes it possible to form the electromagnetic-shielding conductive layer on the photosensitive resin composition layer (B). For expression of the adhesion of the electromagnetic-shielding conductive layer to the photosensitive resin composition layer (B), it is preferable to control the conditions for pressure and heat molding within the above ranges.

(A-2) Paste-Type Electromagnetic-Shielding Conductive Layer

Examples of the paste-type electromagnetic-shielding conductive layer of the present invention encompass, but are not particularly limited to, a film obtained by dispersing silver particles in resin and a film obtained by dispersing nickel particles in resin. Examples of the film obtained by dispersing silver particles encompass a film manufactured under the trade name of RA FS039 by Toyochem Co., Ltd. and a film manufactured under the trade name of XA-9015 by Fujikura Kasei Co., Ltd. Examples of the film obtained by dispersing nickel particles encompass a film manufactured under the trade name of FN-101 by Fujikura Kasei Co., Ltd. and a film manufactured under the trade name of K-3435G by Pelnox Limited.

Examples of a method of forming a paste-type electromagnetic-shielding conductive layer on the photosensitive resin composition layer (B) according to the present invention encompass, but is not particularly limited to, conventionally publicly-known printing methods such as flexographic printing, gravure printing, screen printing, and rotary screen printing. The electromagnetic-shielding conductive layer can be formed on the photosensitive resin composition layer (B) by forming a film on the insulating film through the printing method and then heating the film at a heating temperature of 25° C. to 150° C. for a heating time of 10 minutes to 180 minutes in an oven with internal air circulation. For expression of electric conductivity and the adhesion of the electromagnetic-shielding conductive layer to the photosensitive resin composition layer (B), it is preferable to control the printing and heating conditions within the above ranges.

(A-3) Metal-Thin-Film-Type Electromagnetic-Shielding Conductive Layer

The metal-thin-film-type electromagnetic-shielding conductive layer of the present invention is a conductive film that is obtained by forming a metal thin film directly on the photosensitive resin composition layer (B). Examples of a method of forming a metal-thin-film-type electromagnetic-shielding conductive layer on the photosensitive resin composition layer (B) according to the present invention encompass, but are not particularly limited to, physical vapor deposition (PVD) such as vacuum vapor deposition, sputtering, and ion plating; chemical vapor deposition (CVD); and (iii) liquid phase deposition such as non-electrolytic plating. In particular, vacuum vapor deposition is desirable in view of mass productivity, and is preferable because it makes it possible to produce metal thin films stably and inexpensively. The term "vacuum vapor deposition" here means a method of forming a metal thin film on a surface of a targeted base material by vaporizing or sublimating a metal through heating under a vacuum condition. Examples of the metal to be deposited encompass, but are not particularly limited to, silver, copper, aluminum, gold.

[Photosensitive Resin Composition Layer (B)]

The photosensitive resin composition layer (B) of the present invention is not limited provided that it is a material formed from a photosensitive resin composition comprising at least (a) carboxyl-group-containing resin, (b) a photo-polymerization initiator, and (c) thermosetting resin. Further, the photosensitive resin composition layer (B) of the present invention (i) can be subjected to a fine wiring fabrication process and a density enhancing process by exposing and developing the photosensitive resin composition, (ii) maintains the adhesion to the electromagnetic-shielding conductive layer even after the electromagnetic-shielding conductive layer is processed, and (iii) maintains the electronic insulating property in the thickness direction. (B) The photosensitive resin layer preferably has a thickness of 5 μm to 100 μm. The thickness of the photosensitive resin composition layer (B) of the present invention can be measured by any method, e.g., by a method in conformity to JIS K 5400 3.5. In order for the photosensitive resin composition layer (B) to be excellent in flexibility and in electrical insulation reliability, it is preferable to control the thickness within the above range. If the thickness is 5 μm or less, the photosensitive resin composition layer (B) may be low in electrical insulation reliability, meanwhile, if the thickness is 100 μm or more, the photosensitive resin composition layer (B) may be low in flexibility. The following description will discuss (a) the carboxyl-group-containing resin, (b) the photo-polymerization initiator, and (c) the thermosetting resin.

[(a) Carboxyl-Group-Containing Resin]

The carboxyl-group-containing resin (a) of the present invention is one of components constituting the photosensitive resin composition of the photosensitive resin composition layer (B). A material of the carboxyl-group-containing resin (a) of the present invention is not limited provided that it has at least one carboxyl group in its molecule. Further, the carboxyl-group-containing resin (a) is preferably resin having a weight-average molecular weight of 3,000 or more but 300,000 or less based on polyethylene glycol. As a method of measuring the weight-average molecular weight, for example, the following method can be employed.

Device: Counterpart of HLC-8220GPC (Manufactured by TOSOH CORPORATION)
Column: Two TSK gel Super AWM-H (6.0 mm I.D.×15 cm) (Manufactured by TOSOH CORPORATION)
Guard column: TSK guard column Super AW-H (Manufactured by TOSOH CORPORATION)
Eluent: 30 mM LiBr+20 mM $H_3PO_4$ in DMF
Flow rate: 0.6 mL/min
Column temperature: 40° C.

Detection condition: RI:polarity (+), Response (0.5 sec)
Sample concentration: Approximately 5 mg/mL
Reference standard:PEG (polyethylene glycol).

It is preferable to control the weight-average molecular weight within the above range because the photosensitive resin composition becomes excellent in developability and the photosensitive resin composition layer (B) becomes excellent in flexibility and in chemical resistance. If the weight-average molecular weight is 1,000 or less, the flexibility or the chemical resistance may be decreased. Meanwhile, if the weight-average molecular weight is 1,000,000 or more, viscosity of the photosensitive resin composition may be increased.

An acid value, which is an index indicating a carboxyl group content of the carboxyl-group-containing resin (a), can be measured by, for example, a method in conformity to JIS K5601-2-1. The acid value of the carboxyl-group-containing resin (a) is preferably set to 50 mgKOH/g to 200 mgKOH/g, and more preferably 50 mgKOH/g to 150 mgKOH/g. If the acid value is less than 50 mgKOH/g, the developability of the photosensitive resin composition may be decreased, meanwhile, if the acid value is more than 200 mgKOH/g, a moisture-absorption property of the photosensitive resin composition layer (B) may be increased and the electrical insulation reliability may be decreased.

The carboxyl-group-containing resin (a) of the present invention is not particularly limited provided that it has the above structure. Examples of the carboxyl-group-containing resin (a) encompass: carboxyl-group-containing (meth) acrylic copolymer, carboxyl-group-containing vinyl copolymer, acid-modified polyurethane, acid-modified polyester, acid-modified polycarbonate, acid-modified polyamide, and acid-modified polyimide, and these resins can be used alone, or two or more thereof can be used in combination. It is more preferable to use resin in which at least a (meth)acrylic acid and a (meth)acrylic acid alkyl ester are copolymerized. For expression of the excellent photosensitivity of the carboxyl-group-containing resin (a) and of the excellent flexibility and chemical resistance of the resultant photosensitive composition layer (B), it is preferable to have the above structure.

The (meth)acrylic acid alkyl ester is a compound having $C_1$-$C_{20}$ alkyl group at an ester chain of a (meth)acrylic acid ester, and examples of the (meth)acrylic acid alkyl ester encompass methyl (meth)acrylate, ethyl (meth)acrylate, butyl (meth)acrylate, isobutyl (meth)acrylate, tertiary butyl (meth)acrylate, hexyl (meth)acrylate, 2-ethylhexyl (meth) acrylate, octyl (meth)acrylate, nonyl (meth)acrylate, decyl (meth)acrylate, dodecyl (meth)acrylate, and stearyl (meth) acrylate, and these esters can be used alone, or two or more thereof can be used in combination. Among those (meth) acrylic acid alkyl esters, it is particularly preferable to use methyl (meth)acrylate, ethyl (meth)acrylate, and butyl (meth) acrylate in terms of the flexibility and the chemical resistance of the photosensitive resin composition layer (B).

The above reaction in which at least a (meth)acrylic acid and a (meth)acrylic acid alkyl ester are copolymerized can be conducted by, for example, generating radicals with use of a radical polymerization initiator. Examples of the radical polymerization initiator encompass: azo-based compounds such as azobisisobutyronitrile, azobis(2-methylbutyronitrile), and 2,2'-azobis-2,4-dimethylvaleronitril; organic peroxides such as t-butyl hydroperoxide, cumene hydroperoxide, benzoyl peroxide, dicumyl peroxide, and di-t-butyl perodxide; and persulfates such as potassium persulfate, sodium persulfate, and ammonium peroxodisulfate; and hydrogen peroxide. Those radical polymerization initiators can be used alone, or two or more thereof can be used in combination.

A usage amount of the radical polymerization initiator is preferably 0.001 part by weight to 5 parts by weight with respect to 100 parts by weight of monomer to be used, and more preferably 0.01 part by weight to 1 part by weight. If the usage amount of the radical polymerization initiator is less than 0.001 part by weight, the reaction does not smoothly progress. Meanwhile, if the usage amount of the radical polymerization initiator is more than 5 parts by weight, a molecular weight of the resin in which at least a (meth)acrylic acid and a (meth)acrylic acid alkyl ester are copolymerized may be reduced.

The above reaction can be performed without using a solvent, however, it is desirable to perform the reaction in a solvent system in order to control the reaction. Examples of the organic solvent encompass, but are not particularly limited to, sulfoxide solvents such as dimethyl sulfoxide and diethyl sulfoxide; formamide solvents such as N,N-dimethyl formamide and N,N-diethyl formamide; acetamide solvents such as N,N-dimethylacetamide and N,N-diethylacetamide; pyrrolidone solvents such as N-methyl-2-pyrrolidone and N-vinyl-2-pyrrolidone; hexamethylphosphoramide; and γ-butyrolactone. Furthermore, when needed, these organic polar solvents may be used in combination with aromatic hydrocarbon such as xylene or toluene.

Further examples of the organic solvent encompass: solvents of symmetric glycol diethers such as methyl monoglyme (1,2-dimethoxyethane), methyl diglyme (bis(2-methoxyethyl) ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); solvents of acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (also known as carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether. Among them, symmetric glycol diethers are preferable because symmetric glycol diethers hardly cause a side reaction.

It is preferable that the amount of a solvent that is used in the reaction be such that a solute concentration by weight in a reaction solution, i.e., a concentration of the reaction solution is 5 wt % or more but 90 wt % or less. The solute concentration by weight in the reaction solution is more preferably 20 wt % or more but 70 wt % or less. In the case where the concentration of the reaction solution is lower than 5 wt %, it may be so hard for a polymerization reaction to take place and there is a decrease in reaction speed, and it may be impossible to prepare a desired structural substance. In the case where the concentration of the reaction solution is higher than 90 wt %, the reaction solution is so high in viscosity that the reaction may not be uniform.

The reaction takes place at a temperature of preferably 20° C. to 120° C. or more preferably 50° C. to 100° C. If the temperature is lower than 20° C., the reaction takes too much time. If the temperature is higher than 120° C., there may occur rapid progress of the reaction and gelatinization due to a side reaction accompanied by three-dimensional crosslinking. The duration of the reaction can be determined as appropriate according to the scale of a batch and the conditions to be set for the reaction.

[(b) Photopolymerization Initiator]

The photopolymerization initiator (b) of the present invention is one component constituting the photosensitive resin composition of the photosensitive resin composition layer (B), and is a compound that is activated by energy of UV or the like, and initiates and accelerates a reaction of a radically-polymerizable-group-containing resin. Examples of the component (b) of the present invention encompass Michler's ketone, 4,4'-bis(diethylamino)benzophenone, 4,4',4"-tris(dimethylamino)triphenylmethane, 2,2'-bis(2-chlorophenyl)-4,4',5,5'-tetraphenyl-1,2'-diimidazole, acetophenone, benzoin, 2-methylbenzoin, benzoin methyl ether, benzoin ethyl ether, benzoin isopropyl ether, benzoin isobutyl ether, 2-t-butylanthraquinone, 1,2-benzo-9,10-anthraquinone, methylanthraquinone, thioxanthone, 2,4-diethylthioxanthone, 2-isopropylthioxanthone, 1-hydroxycyclohexyl phenyl ketone, diacetylbenzyl, benzyl dimethyl ketal, benzyl diethyl ketal, 2(2'-furilethylidene)-4,6-bis(trichloromethyl)-S-triazine, 2[2'(5"-methylfuril)ethylidene]-4,6-bis(trichloromethyl)-S-triazine, 2(p-methoxyphenyl)-4,6-bis(trichloromethyl)-S-triazine, 2,6-di(p-azidobenzal)-4-methylcyclohexanone, 4,4'-diazidochalcon, di(tetraalkylammonium)-4,4'-diazidostilbene-2,2'-disulfonate, 2,2-dimethoxy-1,2-diphenylethane-1-on, 1-hydroxycyclohexyl-phenyl-ketone, 2-hydroxy-2-methyl-1-phenyl-propane-1-on, 1-[4-(2-hydroxyethoxy)-phenyl]-2-hydroxy-2-methyl-1-propane-1-on, 2-methyl-1-[4-(methylthio)phenyl]-2-morpholinopropane-1-on, 2-benzyl-2-dimethylamino-1-(4-morpholinophenyl)-butane-1, bis(2,4,6-trimethylbenzoyl)-phenylphosphine oxide, bis(2,6-dimethoxybenzoyl)-2,4,4-trimethyl-pentylphosphine oxide, 2,4,6-trimethylbenzoyl-diphenyl-phosphine oxide, 2-hydroxy-2-methyl-1-phenyl-propane-1-ketone, bis(n5-2,4-cyclopentadiene-1-yl)-bis(2,6-difluoro-3-(1H-pyrrol e-1-yl)-phenyl)titanium, 1,2-octanedione, 1-[4-(phenylthio)-,2-(O-benzoyloxime)], iodonium, (4-methylphenyl) [4-(2-methylpropyl)phenyl]-hexafluorophosph ate(1-), ethyl-4-dimethylaminobenzoate, 2-ethylhexyl-4-dimethylaminobenzoate, ethanone, 1-[9-ethyl-6-(2-methylbenzoyl)-9H-carbazol-3-yl]-1-(O-acetyloxime), etc. It is desirable to select from among these photopolymerization initiators (e) as appropriate, and it is desirable to use one or more thereof in combination.

In order for the resultant photosensitive resin composition to improve in photosensitivity, it is preferable that the amount of the photopolymerization initiator (b) of the present invention that is blended with 100 parts by weight of a total of the components (a) and (c) be 0.1 to 50 parts by weight. If the amount of the component (b) is less than the above range, the radically polymerizable group hardly reacts while the resin composition is being irradiated with light, with the result that the resin composition insufficiently cures. If the amount of the component (b) exceeds the above range, it is difficult to adjust the amount of light with which the resin composition is irradiated, with the result that the resin composition is overexposed to light. Therefore, in order for the photo-curing reaction to proceed efficiently, it is preferable to adjust the amount of the component (e) within the above range.

[(c) Thermosetting Resin]

The thermosetting resin (c) of the present invention is a component constituting the photosensitive resin composition of the photosensitive resin composition layer (B), and is a compound which forms a crosslinked structure when heated, and which functions as a thermosetting agent. Examples of the thermosetting resin (c) of the present invention encompass: thermosetting resins such as epoxy resin, bismaleimide resin, bisallylnadiimide resin, acrylic resin, methacrylic resin, hydrosilyl resin, allyl cured resin, and unsaturated polyester resin; a side-chain reactive-group type thermosetting polymer having a reactive group such as an allyl group, a vinyl group, an alkoxysilyl group, or a hydrosilyl group in a side chain or terminal of a polymer chain; etc. These thermosetting resins can be used alone, or two or more of them can be used in combination. Among these thermosetting components, it is preferable to use epoxy resin as the component (c). In order for the photosensitive resin composition layer (B) to have the heat resistance, adhesion to the wiring-pattern-equipped film, and adhesiveness to the electromagnetic-shielding conductive layer, it is preferable to contain an epoxy resin component. The epoxy resin is a compound having at least one epoxy group in its molecule. Examples of epoxy resins encompass: bisphenol A epoxy resins such as those manufactured under the trade names of jER828, jER1001, and jER1002 by Japan Epoxy Resins Co., Ltd., those manufactured under the trade names of ADEKA RESIN EP-4100E and ADEKA RESIN EP-4300E by Adeka Corporation, those manufactured under the trade names of RE-3105 and RE-4105 by Nippon Kayaku Co., Ltd., those manufactured under the trade names of EPICLON 840S, EPICLON 850S, EPICLON 1050, and EPICLON 7050 by Dainippon Ink and Chemicals, and those manufactured under the trade names of Epotote YD-115, Epotote YD-127, and Epotote YD-128 by Tohto Kasei Co., Ltd; bisphenol F epoxy resins such as those manufactured under the trade names of jER806 and jER807 by Japan Epoxy Resins Co., Ltd., those manufactured under the trade names of ADEKA RESIN EP-4901E and ADEKA RESIN EP-4930, and ADEKA RESIN EP-4950 by Adeka Corporation, those manufactured under the trade names of RE-3035, RE-3045, RE-4035, and RE-4045 by Nippon Kayaku Co., Ltd., those manufactured under the trade names of EPICLON 830 and EPICLON 835 by DIC Corporation, those manufactured under the trade names of Epotote YDF-170, Epotote YDF-1755, and Epotote YDF-2001 by Tohto Kasei Co., Ltd; bisphenol S epoxy resins such as that manufactured under the trade name of EPICLON EXA-1514 by DIC Corporation; hydrogenated bisphenol A epoxy resins such as those manufactured under the trade names of jERYX8000, jERYX8034, and jERYL7170 by Japan Epoxy Resins Co., Ltd., that manufactured under the trade name of ADEKA RESIN EP-4080E by Adeka Corporation, that manufactured under the trade name of EPICLON EXA-7015 DIC Corporation, those manufactured under the trade names of Epotote YD-3000 and Epotote YD-4000D by Tohto Kasei Co., Ltd.; biphenyl epoxy resins such as those manufactured under the trade names of jERYX4000, jERYL6121H, jERYL6640, and jERYL6677 by Japan Epoxy Resins Co., Ltd. and those manufactured under the trade names of NC-3000 and NC-3000H by Nippon Kayaku Co., Ltd.; phenoxy epoxy resins such as those manufactured under the trade names of jER1256, jER4250, and jER4275 by Japan Epoxy Resins Co., Ltd.; naphthalene epoxy resins such as those manufactured under the trade names of EPICLON HP-4032, EPI- CLON HP-4700, and EPICLON HP-4200 by DIC Corporation, and that manufactured under the trade name of NC-7000L (trade name) by Nippon Kayaku Co., Ltd.; phenol novolac epoxy resins such as those manufactured under the trade names of jER152 and jER154 by Japan Epoxy Resins Co., Ltd., that manufactured under the trade name of EPPN-201-L by Nippon Kayaku Co., Ltd., those manufactured under the trade names of EPICLON N-740 and EPICLON N-770 by DIC Corporation, and that manufactured under the trade name of Epotote YDPN-638 by Tohto Kasei Co., Ltd.; cresol novolac epoxy resins such as those manufactured under the trade names of EOCN-1020, EOCN-102S, EOCN-103S, and EOCN-104S by Nippon Kayaku Co., Ltd. and those manufactured under the trade names of EPICLON N-660, EPICLON N-670, EPICLON N-680, and EPICLON N-695 by DIC Corporation; trisphenol methane epoxy resins such as those manufactured under the trade names of EPPN-501H, EPPN-501HY, and EPPN-502H Nippon Kayaku Co., Ltd.; dicyclopentadiene epoxy resins such as that manufactured under the trade name of XD-1000 by Nippon Kayaku Co., Ltd. and that manufactured under the trade name of EPICLON HP-7200 by DIC Corporation; amine epoxy resins such as those manufactured under the trade names of Epotote YH-434 and Epotote YH-434L by Tohto Kasei Co., Ltd.; flexible epoxy resins such as those manufactured under the trade names of jER871, jER872, jERYL7175, and jERYL7217 by Japan Epoxy Resins Co., Ltd. and that manufactured under the trade name of EPICLON EXA-4850 by DIC Corporation; urethane-modified epoxy resins such as those manufactured under the trade names of ADEKA RESIN EPU-6, ADEKA RESIN EPU-73, and ADEKA RESIN EPU-78-11 by Adeka Corporation; rubber-modified epoxy resins such as those manufactured under the trade names of ADEKA RESIN EPR-4023, ADEKA RESIN EPR-4026, and ADEKA RESIN EPR-1309 by Adeka Corporation; and chelate-modified epoxy resins such as ADEKA RESIN EP-49-10 and ADEKA RESIN EP-49-20 by Adeka Corporation.

A curing agent of the thermosetting resin of the present invention is not particularly limited. Examples of the curing agent encompass: phenol resins such as phenol novolac resin, cresol novolac resin, and naphthalene phenol resin; amino resin; urea resin; melamine; and dicyandiamide. Those curing agents can be used alone, or two or more thereof can be used in combination.

A curing accelerator is not particularly limited. Examples of the curing accelerator encompass: phosphine-based compounds such as triphenylphosphine; amine-based compounds such as tertiary amine, trimethanolamine, triethanolamine, and tetraethanolamine; borate-based compounds such as 1,8-diaza-bicyclo[5,4,0]-7-undecenium tetraphenylborate; imidazoles such as imidazole, 2-ethyl imidazole, 2-ethyl-4-methyl imidazole, 2-phenyl imidazole, 2-undecyl imidazole, 1-benzyl-2-methyl imidazole, 2-heptadecylimidazole, 2-isopropyl imidazole, 2,4-dimethyl imidazole, and 2-phenyl-4-methyl imidazole; imidazolines such as 2-methyl imidazoline, 2-ethyl imidazoline, 2-isopropyl imidazoline, 2-phenyl imidazoline, 2-undecylimidazoline, 2,4-dimethyl imidazoline, and 2-phenyl-4-methyl imidazoline; azine-based imidazoles such as 2,4-diamino-6-[2'-methylimidazolyl-(1')]-ethyl-s-triazine, 2,4-diamino-6-[2'-undecylimidazolyl-(1')]-ethyl-s-triazine, and 2,4-diamino-6-[2'-ethyl-4'-methylimidazolyl-(1')]-ethyl-s-triazine. Those curing accelerators can be used alone, or two or more thereof can be used in combination.

The amount of the component (c) of the present invention that is blended with 100 parts by weight of a total of the components (a) and (b) is preferably 0.5 parts by weight to 100 parts by weight, more preferably 1 part by weight to 50 parts by weight, or particularly preferably 5 parts by weight to 20 parts by weight. It is preferable to adjust the amount of the component (c) within the above range in order to improve the heat resistance, the chemical resistance, and the electrical insulation reliability of the photosensitive resin composition layer (B).

If the amount of component (c) is less than the above range, the heat resistance of the photosensitive resin composition layer (B) may be inferior in heat resistance and in electrical insulation reliability. If the amount of the thermosetting resin component exceeds the above range, the photosensitive resin composition layer (B) may be fragile and inferior in flexibility and may greatly warp.

Meanwhile, the adhesion to the electromagnetic-shielding conductive layer is improved by setting the number of moles of an epoxy group in the component (c) to be 1.0 to 3.0 times as many as the number of moles of a carboxyl group in the component (a). This setting also improves the electronic insulating property in the thickness direction. Further, it is preferable to set the number of moles of an epoxy group in the component (c) to be 1.8 times to 2.7 times as many as the number of moles of a carboxyl group in the component (a) in terms of sufficient adhesiveness with an electromagnetic-shielding conductive layer and the electronic insulating property in the thickness direction. If the number of moles of an epoxy group in the component (c) is less than the above range, the photosensitive resin composition layer (B) cannot obtain the sufficient adhesiveness to the electromagnetic-shielding conductive layer or the sufficient electronic insulating property in the thickness direction in some cases. Meanwhile, if the number of moles of an epoxy group in the component (c) excesses the above range, cross-linkage density of the photosensitive resin composition layer (B) may be excessively increased whereby the FPC may be largely warped or the flexibility of the FPC may be decreased.

The number of moles of an epoxy group in the component (c) and the number of moles of a carboxyl group in the component (a) are given by formulae below.

The number of moles of an epoxy group=an inverse number of an epoxy equivalent×solid contents of the component($c$)  (Formula 1)

The number of moles of a carboxyl group in the component($a$)=(an acid value of the component($a$)÷a molecular weight of potassium hydroxide÷1000)×solid contents of the component($a$)  (Formula 2)

Here, the term "epoxy equivalent" in Formula 1 is a weight of resin containing one gram equivalent of epoxy group, and is expressed in g/eq. Further, the wording "acid value of the component (a)" in Formula 2 is given by the method described above, and the molecular weight of potassium hydroxide is 56.11 g/mol.

[(d) Fine Particles Containing at Least One Element Selected from the Group Consisting of Phosphorus, Aluminum, and Magnesium]

Fine particles (d) containing at least one element selected from the group consisting of phosphorus, aluminum, and magnesium in accordance with the present invention is one element constituting the photosensitive resin composition of the photosensitive resin composition layer (B) and means fine particles containing at least one element selected from the group consisting of phosphorus, aluminum, and magnesium in its structure. Further, the fine particles (d) containing at least one element selected from the group consisting of phosphorus, aluminum, and magnesium can serve as a flame retardant.

An average particle diameter of the component (d) of the present invention can be measured as a median size based on volume (particle diameter with respect to 50% of a value of cumulative size distribution) by, for example, the following method.

(Average Particle Diameter Measurement)
Apparatus: Equivalent of LA-950V2, manufactured by Horiba, Ltd.
Method of measurement: Laser diffraction/scattering.

An average particle diameter of the component (d) of the present invention is not particularly limited. In order for the insulator film (B) to be excellent in flexibility and in flame retardance, it is preferable that the average particle diameter is 1 μm to 10 μm. If the average particle diameter is smaller than 1 μm, the photosensitive resin composition layer (B) may fail to effectively form asperities on a surface thereof and therefore have unsatisfactory adhesion to the electromagnetic-shielding conductive layer (A). If the average particle diameter is 10 μm or larger, the photosensitive resin composition layer (B) may be low in folding endurance.

It is possible to employ any method as means to confirm that the component (d) is contained in the photosensitive resin composition layer (B) of the present invention. An example of such a method is a method including embedding, in a thermosetting resin, a conductive-layer-integrated FPC including the photosensitive resin composition layer (B), exposing a cross-section in the thickness direction of the photosensitive resin composition layer (B) by polishing the photosensitive resin composition layer with an ion beam, and observing the cross-section of the photosensitive resin composition layer (B) with a scanning electron microscope.

(Exposure of Cross-Section of Photosensitive Resin Composition Layer (B))

From a conductive-layer-integrated FPC, a piece measuring 5 mm×3 mm was cut out with a knife. On both surfaces of the piece of the conductive-layer-integrated FPC, a protective film layer and a cover glass layer were formed from epoxy embedding resin and a cover glass, respectively. After that, a cross-section in the thickness direction of the photosensitive resin composition layer (B) was subjected to cross-section polisher processing with an ion beam.

(Cross-Section Polisher Processing)
Apparatus used: Equivalent of SM-09020CP, manufactured by JEOL, Ltd.
Processing condition: 6 kV
(Cross-Section Observation of Insulator Film)

The cross-section in the thickness direction of the photosensitive resin composition layer (B) thus obtained was observed with use of a scanning electron microscope.

(Scanning Electron Microscope Observation)
Apparatus used: Equivalent of S-3000, manufactured by Hitachi High-Technologies Corporation
Observation condition: Accelerating voltage 15 kV
Detector: Reflection electron detection (composition mode)
Magnification: ×1000.

In the reflection electron detection (composition mode) used herein, a difference in average atomic number between observed areas is strongly reflected in contrast, so that an area in which heavy elements are present is observed as a bright (white) area and an area in which light elements are present is observed as a dark (black) area. Therefore, in the case where the photosensitive resin composition layer (B) contains a phosphorus element, which is a heavy element relatively heavier than elements contained in the photosensitive resin composition layer (B), an area where heavy elements are present is observed as a dim (gray) circular or polygonal area, meanwhile, in the case where the photosensitive resin composition layer (B) contains aluminum and magnesium elements, an area where these elements are present is observed as a bright (white) circular or polygonal area.

Further, since information on those elements contained in the component (d) can be obtained by analyzing, with use of a scanning electron microscope-X-ray microanalyzer (SEM-EPMA), an area of the component (d) in the cross-section in the thickness direction of the photosensitive resin composition layer (B), inclusion of phosphor, aluminum, and magnesium elements can be confirmed.

(Scanning Electron Microscope-x-Ray Microanalyzer)
Apparatus used: Equivalent of EMAX-7000, manufactured by Horiba, Ltd.
Analysis conditions: Accelerating voltage 15 kV; elapsed time 900 seconds.

Examples of the component (d) of the present invention encompass, but are not particularly limited to, fine particles containing phosphor element such as fine particles of ammonium polyphosphate, fine particles of melamine phosphate, and fine particles of phosphinate. Those fine particles can be used alone, or two or more of them can be used in combination.

In order for the photosensitive resin composition layer (B) to be excellent in flame retardance and to be less in bleed out, it is preferable that the component (d) of the present invention be fine particles of phosphinate, among other types of fine particles containing a phosphor element. This makes it possible to suppress contact fault and process contamination.

The phosphinate is a compound represented by general formula (8):

[Chem. 1]

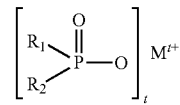

General formula (1)

(where $R_1$ and $R_2$ each independently represent a linear or branched $C_1$-$C_6$ alkyl or aryl group, M represents at least one metal selected from the group consisting of Mg, Ca, Al, Sb, Sn, Ge, Ti, Fe, Zr, Zn, Ce, Bi, Sr, Mn, Li, Na, and K, and t is an integer of 1 to 4).

The phosphinate is not particularly limited provided that it has the above structure. Examples of the phosphinate encompass aluminum tris(diethyl phosphinate), aluminum tris(methylethyl phosphinate), aluminum tris(diphenyl phosphinate), zinc bis(diethyl phosphinate), zinc bis(methylethyl phosphinate), zinc bis(diphenyl phosphinate), titanyl bis(diethyl phosphinate), titanyl bis(methylethyl phosphinate), and titanyl bis(diphenyl phosphinate). These phosphinates can be used alone, or two or more of them can be used in combination. In particular, for high flame retardance, it is preferable to use aluminum tris(diethyl phosphinate) and aluminum tris(methylethyl phosphinate), each of which contains a phosphor element and aluminum.

Further, examples of fine particles containing an aluminum element encompass fine particles of gibbsite-type aluminum hydroxide, fine particles of boehmite aluminum hydroxide, fine particles of aluminum tris(diethyl phosphinate), fine particles of aluminum tris(methylethyl phosphinate), and fine particles of aluminum tris(diphenyl phosphinate). Those fine particles can be used alone, or two or more of them can be used in combination.

Further, examples of the fine particles containing a magnesium element encompass fine particles of magnesium hydroxide and magnesium oxide. Those fine particles can be used alone, or two or more of them can be used in combination.

In order for the resulting insulator film to be excellent in flame retardance and in electrical insulation reliability, the amount of the component (d) of the present invention that is contained in 100 parts by weight of a total of the component (a), the component (b), and the component (c) is preferably 20 parts by weight to 80 parts by weight or more preferably 25 parts by weight to 75 parts by weight. If the amount of the component (c) is smaller than 20 parts by weight, the photosensitive resin composition layer (B) may be inferior in flame retardance. If the amount of the component (d) is larger than 80 parts by weight, the photosensitive resin composition may deteriorate in coating properties during coating. This may cause the film to form bubbles during coating and/or to be poor in appearance due to lack of leveling.

[Other Components]

The photosensitive resin composition of the photosensitive resin composition layer (B) of the present invention may further contain additives such as radically polymerizable resin, a coloring agent, an adhesion-imparting agent, a polymerization inhibitor, and a solvent as needed.

A radically polymerizable resin of the present invention is not limited, provided that it is a resin that forms a chemical bond in response to the photopolymerization initiator (b). Furthermore, it is preferable that the radically polymerizable group be an acrylic group ($CH_2$=CH-group), a methacryloyl group (CH=C($CH_3$)-group), or a vinyl group (—CH=CH-group). Examples of the radically polymerizable resin encompass bisphenol F EO-modified (n=2 to 50) diacrylate, bisphenol A EO-modified (n=2 to 50) diacrylate, bisphenol S EO-modified (n=2 to 50) diacrylate, bisphenol F EO-modified (n=2 to 50) dimethacrylate, bisphenol A EO-modified (n=2 to 50) dimethacrylate, bisphenol S EO-modified (n=2 to 50) dimethacrylate, 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacyrlate, tetramethylolpropane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxy diethylene glycol methacrylate, methoxy polyethylene glycol methacrylate, β-methacryloyloxyethyl hydrogen phthalate, β-methacryloyloxyethyl hydrogen succinate, 3-chloro-2-hydroxypropyl methacrylate, stearyl methacrylate, phenoxyethyl acrylate, phenoxydiethylene glycol acrylate, phenoxypolyethylene glycol acrylate, β-acryloyloxyethyl hydrogen succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, 1,6-hexanediol dimethacrylate, neopentyl glycol dimethacrylate, polypropylene glycol dimethacrylate, 2-hydroxy-1,3-dimethacryloxypropane, 2,2-bis[4-(methacryloxyethoxy)phenyl]propane, 2,2-bis[4-(methacryloxy diethoxy)phenyl]propane, 2,2-bis[4-(methacryloxy polyethoxy)phenyl]propane, polyethylene glycol diacrylate, tripropylene glycol diacrylate, polypropylene glycol diacrylate, 2,2-bis[4-(acryloxy diethoxy)phenyl] propane, 2,2-bis[4-(acryloxy polyethoxy)phenyl]propane, 2-hydroxy-1-acryloxy-3-methacryloxypropane, trimethylolpropane trimethacrylate, tetramethylolmethane triacrylate, tetramethylolmethane tetraacrylate, methoxydipropylene glycol methacrylate, methoxytriethylene glycol acrylate, nonylphenoxypolyethylene glycol acrylate, nonylphenoxypolypropylene glycol acrylate, 1-acryloyloxypropyl-2-phthalate, isostearyl acrylate, polyoxyethylenealkyl ether acrylate, nonylphenoxyethylene glycol acrylate, polypropylene glycol dimethacrylate, 1,4-butanediol dimethacrylate, 3-methyl-1,5-pentanediol dimethacrylate, 1,6-mexanediol dimethacrylate, 1,9-nonanediol methacrylate, 2,4-diethyl-1, 5-pentanediol dimethacrylate, 1,4-cyclohexane dimethanol dimethacrylate, dipropylene glycol diacrylate, tricyclodecane dimethanol diacrylate, 2,2-hydrogenated bis[4-(acryloxy polyethoxy)phenyl]propane, 2,2-bis[4-(acryloxy polypropoxy)phenyl]propane, 2,4-diethyl-1,5-pentanediol diacrylate, ethoxylated trimethylolpropane triacrylate, propoxylated trimethylolpropane triacrylate, isocyanuric acid tri (ethane acrylate), pentaerythritol tetraacrylate, ethoxylated pentaerythritol tetraacrylate, propoxylated pentaerythritol tetraacrylate, ditrimethylolpropane tetraacrylate, dipentaerythritol polyacrylate, triallyl isocyanurate, glycidyl methacrylate, glycidyl allyl ether, 1,3,5-triacryloylhexahydro-s-triazine, triallyl 1,3, 5-benzenecarboxylate, triallylamine, triallyl citrate, triallyl phosphate, allobarbital, diallylamine, diallyl dimethyl silane, diallyl disulfide, diallyl ether, diallyl cyanurate, diallyl isophthalate, diallyl terephthalate, 1,3-diallyloxy-2-propanol, diallyl sulfide diallyl maleate, 4,4'-isopropylidene diphenol dimethacrylate, 4,4'-isopropylidene diphenol diacrylate, but are not particularly limited thereto. In particular, it is preferable to use diacrylate or methacrylate having 2 moles to 50 moles, and more preferably 2 to 40 of a repeating unit of EO (ethylene oxide) per molecule. Use of diacrylate or methacrylate having 2 to 50 of a repeating unit of EO (ethylene oxide) brings about improvement in solubility of the photosensitive resin composition in an aqueous developer, such as an alkaline aqueous solution, and reduction in developing time. Furthermore, stress hardly remains in the photosensitive resin composition layer (B), so that, when laminated on the wiring-pattern-equipped film (C), the photosensitive resin composition layer (B) inhibits the wiring-pattern-equipped film (C) from curling.

Concomitant use of the EO-modified diacrylate or dimethacrylate and acrylic resin having three or more acrylic groups or methacrylic groups is preferable in terms of enhancing the developability. Suitably usable examples encompass acrylic resins such as ethoxylated isocyanuric acid EO-modified triacrylate, ethoxylated isocyanuric acid EO-modified trimethacrylate, ethoxylated trimethylolpropane triacrylate, ethoxylated trimethylolpropane triacrylate, ethoxylated trimethylolpropane triacrylate, trimethylolpropane triacrylate, propoxylated trimethylolpropane triacrylate, pentaerythritol triacrylate, ethoxylated pentaerythritol tetraacrylate, ethoxylated pentaerythritol tetraacrylate, ditrimethylolpropane tetraacrylate, ditrimethylolpropane tetraacrylate, propoxylated pentaerythritol tetraacrylate, pentaerythritol tetraacrylate, dipentaerythritol hexaacrylate, 2,2, 2-trisacryloyloxymethylethyl succinate, 2,2,2-trisacryloyloxymethylethyl phthalate, propoxylated ditrimethylolpropane tetraacrylate, propoxylated dipentaerythritol hexaacrylate, ethoxylated isocyanuric acid triacrylate, ε-caprolactone-modified tris-(2-acryloxy ethyl) isocyanurate, and caprolactone-modified ditrimethylolpropane tetraacrylate.

Further, suitably usable examples are those substances which have a hydroxyl group and/or a carbonyl group within a molecular structural skeleton such as 2-hydroxy-3-phenoxypropyl acrylate, monohydroxyethyl acrylate phthalate, ω-carboxy-polycaprolactone monoacrylate, acrylic acid dimer, pentaerythritol tri- and tetraacrylate.

Other usable examples are radically polymerizable resins such as epoxy-modified acrylic (methacylic) resin, urethane-modified acrylic (methacylic) resin, and polyester-modified acrylic (methacylic) resin.

Although these radically polymerizable resins may be used alone, it is preferable to use, as the radically polymerizable resin, two or more of these radically polymerizable resins in combination to improve the heat resistance of the resultant photo-cured film.

In order for the photosensitive resin composition to improve in photosensitivity, it is preferable that the amount of a radically polymerizable resin of the present invention that is blended with 100 parts by weight of a total of the components (a), (b), (c), and (d) be 10 to 200 parts by weight.

If the amount of a radically polymerizable resin is less than the above range, the photosensitive resin composition may be low in alkali resistance and may have difficulty in gaining contrast when exposed and developed. If the amount of a radically polymerizable exceeds the above range, there may be an increase in stickiness of a film obtained by applying the photosensitive resin composition onto the base material and drying the solvent to thereby reduce productivity, and the crosslinkage density may be so high that the photosensitive resin composition (B) is fragile and breakable. If the amount of a radically polymerizable resin falls within the above range, the resolution with which the photosensitive resin composition is exposed and developed can fall within an optimum range.

Examples of coloring agents of the present invention encompass a phthalocyanine compound, an azo compound, carbon black, titanium oxide, etc. Further, examples of adhesion-imparting agents encompass a silane coupling agent, a triazole compound, a tetrazole compound, a triazine compound, etc. Furthermore, examples of polymerization inhibitors encompass hydroquinone, hydroquinone monomethylether, etc. These additives can be used alone, or two or more of them can be used in combination. Further, the photosensitive resin composition of the present invention may contain an inorganic or organic filler in order to improve adhesion to the wiring-pattern-equipped film and hardness of the photosensitive resin composition layer. While the inorganic filler is not particularly limited, examples of the inorganic filler encompass barium sulfate, barium titanate, talc, ultrafine particle anhydrous silica, synthetic silica, natural silica, calcium carbonate, magnesium carbonate, and aluminum oxide, and examples of the organic filler encompass various organic fillers such as crosslinked urethane beads, polyimide fillers, and acrylic beads. Those inorganic or organic fillers can be used alone, or two or more of them can be used in combination.

A solvent of the present application can be any solvent provided that it is a solvent in which the component (a) to the component (c) can be dissolved. Examples of the solvent encompass: sulfoxide solvents such as dimethyl sulfoxide and diethyl sulfoxide; solvents of symmetric glycol diethers such as methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); solvents of acetates such as γ-butyrolactone, methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (also known as carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether. These solvents can be used alone, or two or more of them can be used in combination.

A solvent of the present invention that is blended with 100 parts by weight of a total of the components (a), (b), (c), and (d) is preferably 10 parts by weight to 400 parts by weight, more preferably 20 parts by weight to 200 parts by weight, and especially preferably 40 parts by weight to 100 parts by weight.

In order to adjust the viscosity or viscous property of the photosensitive resin composition within a range appropriate for coating such as screen printing, it is preferable to adjust the amount of a solvent within the above range.

If the amount of the solvent is less than the above range, the photosensitive resin composition is very high in viscosity. This may make coating so difficult that the film traps bubbles during coating and/or is inferior in leveling. If the amount of the solvent exceeds the above range, the photosensitive resin composition is very low in viscosity. This may also make coating so difficult that the film is inferior in coatability of a circuit.

The photosensitive resin composition (B) of the present invention can be obtained by uniformly mixing the components (a) through (d) and (an)other component(s) together. An example of how to uniformly mix the components (a) through (d) and the (an)other component(s) together is use of a commonly kneading apparatus such as a triple-roll mill or a beads-mill. In the case where the solvent is low in viscosity, it is possible to use a commonly stirring apparatus, instead.

The photosensitive resin composition of the present invention can employ the following 1) or 2) method: 1) a method including applying a solution as it is onto a substrate and forming a pattern; or 2) a method including forming a film on a support, attaching the film, which is uncured, onto the substrate, and forming a pattern. In the case of employing the method 1), the photosensitive resin composition is first applied on the substrate, and the solvent is removed by drying the photosensitive resin composition. The resin composition can be applied onto the substrate by screen printing, roller coating, curtain coating, spray coating, spin coating using a spinner, etc. The applied film (having a thickness of, preferably, 5 μm to 100 μm) is dried at 120° C. or lower, and, preferably 40° C. to 100° C. After the applied film is dried, a negative photomask is placed on the applied film thus dried, and the applied film is exposed by irradiating it with rays of active light such as ultraviolet rays, visible rays, or electron rays. Then, an unexposed area is washed out with a developer using any of various methods such as a shower method, a paddle method, a dipping method, an ultrasonic method, with the result that a pattern can be formed. Since the amount of time required for the pattern to be exposed varies depending on (i) the atomizing pressure and flow rate of the development apparatus and (ii) the temperature of the developer, it is preferable to find optimum conditions for the apparatus as appropriate. It is preferable to use an alkaline aqueous solution as the developer. The developer may contain a water-soluble organic solvent such as methanol, ethanol, n-propanol, isopropanol, or N-methyl-2-pyrrolidone. Examples of an alkaline compound from which the alkaline aqueous solution is prepared encompass hydroxides, carbonates, hydrogencarbonates, or amine compounds of alkaline metals, alkaline earth metals, and ammonium ion. More specifically, examples of the alkaline compounds encompass sodium hydroxide, potassium hydroxide, ammonium hydroxide, sodium carbonate, potassium carbonate, ammonium carbonate, sodium hydrogencarbonate, potassium hydrogencarbonate, ammonium hydrogencarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, and triisopropylamine. It is of course possible to use any other compound provided that the aqueous solution exhibits basicity.

Concentration of an alkaline compound which can be suitably used in the developing step of the photosensitive resin composition of the present invention is preferably 0.01 wt % to 10 wt %, and particularly preferably 0.05 wt % to 5 wt %. The temperature of the developer depends on the composition of the photosensitive resin composition and the composition of the developer. In general, the temperature of the developer is preferably 0° C. or higher but 80° C. or lower, and more preferably 20° C. or higher but 50° C. or lower.

The pattern formed in the developing step is rinsed so that an unnecessary residual developer is removed. Examples of a rinse agent that is used here encompass water and an acidic aqueous solution.

It is possible to produce the photosensitive resin composition layer (B) excellent in heat resistance and in flexibility by performing a thermal curing process after the developing step. How the photosensitive resin composition layer (B) is to be configured is determined in consideration of a thickness of wiring etc., and preferably the photosensitive resin composition layer (B) is configured to have a thickness of about 2 μm to 50 μm. At this time, in order to prevent oxidation of wiring etc. and prevent the adhesion between the wiring and base material from reducing, it is desired that the thermal curing process be performed at a low final curing temperature. A temperature of this thermal curing process in this case is preferably 100° C. or more but 250° C. or less, further preferably 120° C. or more but 200° C. or less, and particularly preferably 130° C. or more but 190° C. or less. When a final heating temperature becomes high, oxidative deterioration of the wiring may progress.

The method 2) is carried out as follows: first, after the photosensitive resin composition is uniformly applied onto the support, heating and/or hot-air blowing is/are carried out, whereby a portion of the solvent is removed, with the result that the photosensitive resin composition can form an uncured film.

The temperature at which the solvent is removed by carrying out heating and/or hot-air blowing needs only be such a temperature that an epoxy group or the like contained in the photosensitive resin composition is not crosslinked by heat. Usable examples of the support used here encompass, but are not particularly limited to, various types of commercially-available film such as a polyethylene terephthalate (PET) film, a polyphenylene sulfide film, and a polyimide film. Among these supports, PET films are often used because they have a certain degree of heat resistance and are comparatively inexpensively available. The surface where the support and the photosensitive resin composition are joined on top of each other may be subjected to a surface treatment for improvements in adhesion and in removability. Further, a protective film may be laminated on the photosensitive resin composition. Laminating the protective film on the photosensitive resin composition prevents dirt and dust in the air from adhering, thus making it possible to prevent the photosensitive resin composition from deteriorating in quality due to dryness. It is preferable that the protective film be laminated on a surface of the photosensitive resin composition at a temperature of 10° C. to 50° C. Note that, if the temperature during this lamination is higher than 50° C., the protective film thermally expands so that the protective film may show wrinkles and curls after the lamination. Since the protective film is removed from the photosensitive resin composition when the photosensitive resin composition is used, it is desirable that the surface where the support and the photosensitive resin composition are joined on top each other have appropriate adhesion at the time of storage and be excellent in removability.

Examples of a material for the protective film encompass, but are not particularly limited to, a polyethylene film (PE film), a polyethylene vinyl alcohol film (EVA film), a "copolymer film of polyethylene and ethylene vinyl alcohol" (hereinafter abbreviated as "(PE+EVA) copolymer film"), a "laminate made by joining a PE film and a (PE+EVA) copolymer film", and a "film made by co-extrusion of a (PE+EVA) copolymer film and polyethylene" (a film having a PE film as one surface thereof and a (PE+EVA) copolymer film as the other surface thereof).

Next, the photosensitive protective film is removed from the film including the protective film, the photosensitive resin composition, and the base film. Then, the wiring-pattern-equipped film is covered with the photosensitive composition film so that the wiring-pattern-equipped film and the photosensitive composition face each other, and they are joined on top of each other by thermocompression bonding. The thermocompression bonding needs only be carried out according to, but is not to be particularly limited to, a thermal press process, a lamination process (thermal lamination process), a heat-roll lamination process, or the like. In the case of a thermal lamination process or a heat-roll lamination process (hereinafter described as "lamination process"), a temperature during the process needs only be equal to or higher than a lower-limit temperature (hereinafter referred to as "bondable temperature") at or above which the lamination process can be carried out. Specifically, the bondable temperature falls within a range of preferably 50° C. to 150° C., more preferably 60° C. to 120° C., and particularly preferably 80° C. to 120° C. If the processing temperature exceeds 150° C., a crosslinking reaction of the photosensitive resin composition due to heating occurs during the lamination process so that curing of the photosensitive resin composition may be accelerated. On the other hand, if the processing temperature is lower than 50° C., the photosensitive resin composition is low in fluidity so that it is difficult to embed a pattern circuit in the photosensitive resin composition.

The photosensitive resin composition, turned into a film, is kept uncured. As such, the photosensitive resin composition is at a moderate level of fluidity when it is subjected to a thermocompression bonding process such as a thermal lamination process, and allows the pattern circuit of the wiring-pattern-equipped film to be suitably embedded in the photosensitive resin composition.

By performing the above thermocompression bonding, it is possible to produce a sample in which the photosensitive resin composition is laminated on the wiring-pattern-equipped film and a base film is further laminated on the photosensitive resin composition. Then, this laminated sample is subjected to pattern exposure and is then developed. When performing the pattern exposure and development, a photomask pattern is placed on the base film of the laminated sample, and is subjected to an exposure process via the photomask. After that, the base film is peeled off and the laminated sample is subjected to a development process. In this way, holes (vias) corresponding to the photomask pattern can be formed. Other exposure and development processes and a heating process step thereafter are similar to the method 1).

[(C) Wiring-Pattern-Equipped Film]

The wiring-pattern-equipped film (C) of the present invention is a film including a base film having a thickness of 5 μm to 100 μm and a wiring pattern(s) on one or both surfaces of the base film. An example of a method of fabricating a wiring-pattern-equipped film according to the present invention is not particularly limited, but for example, the wiring-pattern-equipped film of the present invention can be fabricated by fabricating a flexible metal-clad laminate sheet through formation of a conductive layer on a base film and pattern-etching the conductive layer.

The base film of the present invention is not particularly limited provided that it is a flexible and insulating film. Examples of the base film encompass polypropylene, crosslinked polyethylene, polyester, polybenzimidazole, polyimide, polyimideamide, polyetherimide, polyphenylene sulfide, a liquid crystal polymer, and polyether ether ketone. In the case where the heat resistance is not required, it is preferable to use a polyester film, which is inexpensive. In the case where heat resistance is required, it is preferable to use a polyimide film.

Examples of the conductive layer of the present invention encompass, but are not particularly limited to, a copper and a copper alloy, stainless steel and an alloy thereof, nickel and a nickel alloy (inclusive of a 42 alloy), and aluminum and an aluminum alloy. Copper foils such as rolled copper foil and electrolytic copper foil, which are often used in common flexible metal-clad laminate sheets, can also be used preferably in the present invention. Note that these sheets of metal foil may have a surface coated with an antirust layer, a heat-resistant layer, or an adhesive layer.

Examples of a method of forming a conductive layer on a base film of the present invention, i.e., a method of fabricating a flexible metal-clad laminate sheet according to the present invention, encompass, but are not particularly limited to, a casting method, a laminating method, and a metalizing method. The casting method is a method including applying a base film in liquid form onto a conductive layer and drying and thermally curing the base film. The laminating method is a method including forming a base film and a conductive layer by thermocompression bonding. The laminating method is categorized into two types of laminating method: (1) a laminating method of fabricating a so-called three-layer metal-clad laminate sheet including a base film and a conductive layer with an adhesive sandwiched therebetween; and (2) a laminating method of fabricating a so-called two-layer metal-clad laminate sheet including a base film and a conductive layer without an adhesive sandwiched therebetween. Examples of the adhesive include an epoxy resin and an acrylic resin. Further, the metalizing method is a method including forming a metal thin film on a base film by vacuum vapor deposition or sputtering and forming a conductive layer by wet plating. Another type of metalizing method may include forming a conductive layer by wet plating without forming a metal thin film. It is possible to employ any of these methods to form a conductive layer(s) on one or both surfaces of a base film.

Examples of a method of pattern-etching a conductive layer according to present invention encompass, but are not particularly limited to, a photoresist technique. The photoresist technique is a method of forming a wiring pattern by forming a photoresist layer on a metal-clad laminate sheet, exposing the photoresist layer, developing the photoresist layer, etching a conductive layer, and removing a dry film. The photoresist layer can come in a positive or negative type, and can also come in liquid form, film form, or the like. An example of photoresist is, but is not particularly limited to, a method of forming a negative dry film resist on a metal-clad laminate sheet by thermal lamination or for forming a positive liquid resist on a metal-clad laminate sheet by coating and drying. In the case of a negative type, portions other than those exposed are removed by development, meanwhile, in the case of a positive type, those portions exposed are removed. A dry film resist can easily form into a thick film. Examples of the negative dry film resists encompass a resist manufactured under the trade name of SPG-152 by Asahi Kasei Co., Ltd., a resist manufactured under the trade name of RY-3215 Hitachi Chemical Co., Ltd., etc. A possible example of a method of removing a photoresist layer by development is to select and use a publicly-known chemical as appropriate for removing a photoresist layer, e.g., to remove a photoresist layer by development by spraying an aqueous solution of sodium carbonate (e.g., 0.2% to 1.5%). A possible example of conductive-layer etching is to select and use a publicly-known conductive-layer etchant as appropriate, e.g., to use an aqueous solution of potassium ferricyanide, an aqueous solution of ferric chloride, an aqueous solution of copper chloride, an aqueous solution of ammonium persulfate, an aqueous solution of sodium persulfate, a hydrogen peroxide solution, an aqueous solution of hydrofluoric acid, and any combination thereof.

A conductive-layer-integrated FPC of the present invention is excellent in adhesion between an electromagnetic-shielding conductive layer and a photosensitive resin composition layer, excellent in flexibility that can withstand repeated folding, in flame retardance, and in electrical insulation reliability, and free from large warpage. As such, it is especially suitable as an FPC for use in liquid crystal displays, sensors, and camera modules of small-sized mobile terminals. Furthermore, it can be used as an FPC for use in hinge bending, slide bending, cables, connectors, hard-disk optical pickup, etc.

The present invention is not limited to the description of the embodiments above, but may be altered by a skilled person within the scope of the claims. An embodiment based on a proper combination of technical means disclosed in different embodiments is encompassed in the technical scope of the present invention. All of those academic documents mentioned herein are used as references. The present invention is described in more detail below by way of Examples; however, the present invention is not to be limited solely to these Examples.

EXAMPLES

The present invention will be described in concrete terms below by way of Examples, however, the present invention is not to be limited by these Examples.

(a) Carboxyl-Group-Containing Resin

Synthesis Example 1

Into a reaction vessel equipped with a stirrer, a thermometer, a dropping funnel, and a nitrogen-introducing inlet tube, 100.0 g of methyl triglym (=1,2-bis(2-methoxyethoxy)ethane) were fed as a solvent for polymerization. The solvent was heated to 80° C. under stirring with streams of nitrogen. Then, a mixture of 12.0 g (0.14 mol) of methacrylate, 28.0 g (0.16 mol) of benzyl methacrylate, 60.0 g (0.42 mol) of butyl methacrylate, and, as a radical polymerization initiator, 0.5 g of azobisisobutyronitrile, which had been mixed in advance at room temperature, was dropped through a dropping funnel for 3 hours while being kept at 80° C. After the dropping, the reaction solution was heated to 90° C. under stirring, and the reaction solution was further stirred for 2 hours while being kept at 90° C. Thus obtained was a carboxyl-group-containing resin solution (a-1) of the present invention. The carboxyl-group-containing resin solution thus obtained had a solid content concentration of 48%, a weight-average molecular weight of 48,000, and an acid value of 78 mgKOH/g. Note that the solid content concentration, the weight-average molecular weight, and the acid value were measured as follows.

<Solid Content Concentration>

The solid content concentration was measured in conformity to JIS K 5601-1-2. As a condition for drying, a condition of 150° C.×1 hour was selected.

<Weight-Average Molecular Weight>

The weight-average molecular weight of the poly(meth)acrylic resin solution (a) thus synthesized was measured under the following conditions.
Apparatus used: Equivalent of HLC-8220GPC, manufactured by Tosoh Corporation
Column: Two TSK gel Super AWM-H (6.0 mm I.D.×15 cm), manufactured by Tosoh Corporation
Guard column: TSK guard column Super AW-H, manufactured by Tosoh Corporation
Eluent: 30 mM LiBr+20 mM H3PO4 in DMF
Flow rate: 0.6 mL/min
Column temperature: 40° C.
Detection condition: RI: polarity (+), Response (0.5 sec)
Sample concentration: Approximately 5 mg/mL
Reference standard: PEG (polyethylene glycol).

<Acid Value>

The acid value of the carboxyl-group-containing resin solution (a) thus synthesized was measured in conformity to JIS K 5601-2-1.

Examples 1 to 6 and Comparative Example 1

Preparation of Photosensitive Resin Composition

A photosensitive resin composition was prepared by adding the carboxyl-group-containing resin (a) obtained in Synthesis Example 1, a photopolymerization initiator (b), thermosetting resin (c), fine particles (d) containing at least one selected from the group consisting of phosphorus, aluminum, and magnesium, and an(other) component(s). Table 1 shows the amount of each ingredient that is contained in the resin solid content and the types of the ingredients. In Table 1, the amount of 1,2-bis(2-methoxyethoxy)ethane, which serves as a solvent, is a total amount including the amount of the solvent that is contained in the resin solution synthesized in Synthesis Example 1. The mixed solution was completely defoamed by a defoaming device, and was evaluated as will be explained below.

TABLE 1

| Constituent Elements of Resin Composition | Ingredients | Ex. 1 | Ex. 2 | Ex. 3 | Ex. 4 | Ex 5 | Ex. 6 | Comp. Ex. 1 |
|---|---|---|---|---|---|---|---|---|
| Component (a) | a-1 | 40.0 | 40.0 | 40.0 | 40.0 | 40.0 | 40.0 | 40.0 |
| Component (b) | IRGACURE819 [1] | 5.0 | 5.0 | 5.0 | 5.0 | 5.0 | 5.0 | 5.0 |
| Component (c) | JER630 [2] | 6.0 | 10.0 | 15.0 | 30.0 | 15.0 | 15.0 | 0 |
| Component (d) | Exolit OP-935 [3] | 30.0 | 30.0 | 30.0 | 30.0 | 0.0 | 0.0 | 30.0 |
| | HIGILITE H42M [4] | 0.0 | 0.0 | 0.0 | 0.0 | 30.0 | 0.0 | 0.0 |
| | ECOMAG Z-10 [5] | 0.0 | 0.0 | 0.0 | 0.0 | 0.0 | 30.0 | 0.0 |
| Other components | A-9300 | 4.0 | 4.0 | 4.0 | 4.0 | 4.0 | 4.0 | 4.0 |
| | Aerosil R-974 [5] | 1.0 | 1.0 | 1.0 | 1.0 | 1.0 | 1.0 | 1.0 |
| | 1,2-bis(2-methoxyethoxy) ethane | 42.2 | 42.2 | 42.2 | 42.2 | 42.2 | 42.2 | 42.2 |
| Number of moles of component-(c)-containing epoxy group/number of moles of component-(a)-containing carboxyl group | | 1.0 | 1.8 | 2.7 | 5.4 | 2.7 | 2.7 | 0.0 |

[1] Product name of photopolymerization initiator manufactured by Ciba Specialty Chemicals Inc.
[2] Product name of multifunctional epoxy resin of a glycidyl amine type manufactured by DIC Corporation
[3] Product name of fine particles containing phosphor element and aluminum (aluminum diethyl phosphinate) manufactured by Clariant Japan K.K.; Average particle diameter: 2.5 μm
[4] Product name of fine particles containing aluminum elements (aluminum hydroxide), average particle diameter 1.0 μm, manufactured by SHOWA DENKO K.K.
[5] Product name of fine particles containing magnesium elements (magnesium hydroxide), average particle diameter 1.0 μm, manufactured by Tateho Chemical Industries Co., Ltd.
[6] Product name NK Ester A-9300 (ethoxylated isocyanuric acid triacrylate), manufactured by Shin-Nakamura Chemical Co., Ltd.
[7] Product name of silica particles manufactured by Nippon Aerosil Co., Ltd.

[Evaluation of Photosensitive Resin Composition]
<Fabrication of Evaluation Test Pieces>
From the photosensitive resin composition thus prepared, an insulator film was fabricated as follows: First, the resin composition was flow-cast and applied onto an area of 100 mm×100 mm of a 75-μm-thick polyimide film (manufactured under the trade name of 75NPI by Kaneka Corporation) by using a Baker's applicator and dried at 80° C. for 20 minutes so that the final dried film had a thickness of 25 μm. Then, a negative photomask having an area of 50 mm×50 mm (line width/space width=100 μm/100 μm) is placed, and exposure was carried out by ultraviolet irradiation with an integral exposure amount of 300 mJ/cm². Then, an aqueous solution of 1.0 wt % of sodium carbonate was heated to 30° C. and sprayed for 60 seconds at a discharge pressure of 1.0 kgf/mm². After this development, the resultant film was sufficiently washed with pure water, and then cured for 90 minutes in an oven at 160° C. Thus the photosensitive resin composition layer (B) was fabricated.

<Evaluation of Photosensitive Resin Composition Layer (B)>

The photosensitive resin composition layer thus obtained were evaluated for the following evaluation items. Table 2 shows results of the evaluation.

(i) Photosensitivity Evaluation

Photosensitivity of the photosensitive resin composition was evaluated by observing a surface of the photosensitive resin composition layer (B) obtained in the above <Fabrication of evaluation test pieces>.

Good (○): a polyimide film in which a clear photosensitive pattern of line width/space width=100/100 μm is formed on a surface thereof, waving of lines caused by peeling off of a line section does not occur, and a residue does not exist in a space section.

Fair (Δ): a polyimide film in which a clear photosensitive pattern of line width/space width=100/100 μm is formed on a surface thereof and a residue does not exist in a space section, but waving of lines caused by peeling off of the line section occurs Poor (x): a polyimide film in which a clear photosensitive pattern of line width/space width=100/100 μm is not formed on a surface thereof, waving of lines caused by peeling off of the line section occurs, and a residue exists in a space section (ii) Solvent Resistance Solvent resistance of the photosensitive resin composition layer (B) obtained in the above <Fabrication of evaluation test pieces> was evaluated. An evaluation method was as follows: the photosensitive resin composition layer (B) was dipped in methyl ethyl ketone at 25° C. for 15 minutes and was then air-dried; and a condition of a surface of the film was observed.

○: applied film is normal
x: applied film is abnormal (e.g., swelling or peeling off of the applied film occurs)

(iii) Bendability

In the same manner as in section <Fabrication of evaluation test pieces> above, the photosensitive resin composition was fabricated on a surface of a 25-μm-thick polyimide film (Apical 25NPI, manufactured by Kaneka Corporation). Each of the test pieces thus obtained was cut into a strip measuring 30 mm×10 mm. The presence or absence of cracks was confirmed by folding the strip 10 times at 180° at 15 mm from an edge along a long side and visually checking the film.

Good (○): Found no cracks in the photosensitive resin composition layer (B)
Fair (Δ): Found a few cracks in the photosensitive resin composition layer (B)
Poor (x): Found cracks in the photosensitive resin composition layer (B)

(Iv) Solder Heat Resistance

In the same manner as in the above <Fabrication of evaluation test pieces>, the photosensitive resin composition layer (B) was fabricated on a 75-μm-thick polyimide film (manufactured under the trade name of Apical 75NPI by Kaneka Corporation). The test pieces thus fabricated were floated in a solder bath in which solder was fully dissolved at 260° C. so that a surface on which the photosensitive resin composition layer (B) was fabricated was in contact with the soldering bath, and, after 10 seconds, the test pieces were raised. This operation was repeated three times, and then a strength of adhesive bonding of the photosensitive resin composition layer (B) was evaluated by a cross-cut adhesion testing in conformity to JIS K5400.

Good (○): Showed no peels as a result of cross-cut adhesion testing
Fair (Δ): 95% or more of the squares remained
Poor (x): Only less than 80% of the squares remained (v) Warpage In the same manner as in the above <Fabrication of evaluation test pieces>, the photosensitive resin composition layer (B) was fabricated on a surface of a 25-μm-thick polyimide film (Apical 25NPI, manufactured by Kaneka Corporation). The photosensitive resin composition layer (B) was cut into films each measuring 50 mm×50 mm, and each film was placed on a flat base so that a surface on which the photosensitive resin composition layer (B) was fabricated was turned upward. Then the height of warpage of an edge of the each film was measured. FIG. 3 is a diagram schematically showing a measurement site. A smaller amount of the warpage of the surface of the polyimide film indicates that a printed wiring board has a smaller stress at its surface, which results in reduction in warpage of the printed wiring board. A preferred amount of the warpage is 5 mm or smaller.

(vi) Flame Retardance

A flame retardance test was carried out in conformity to UL94, which is a standard for testing the flame retardance of plastic materials, as follows: in the same manner as in the above <Fabrication of evaluation test pieces>, photosensitive resin composition layers (B) were fabricated on both surfaces, respectively, of a 25-μm-thick polyimide film (Apical 25NPI, manufactured by Kaneka Corporation). Each of the test pieces was cut into test pieces each measuring 50 mm wide×200 mm long×75 μm thick (including the thickness of the polyimide film). Then, a marked line was drawn on each of the test pieces at 125 mm from one edge thereof along a long side. Each of the test pieces was rolled into a tubular shape having a diameter of approximately 13 mm. A PI tape was attached onto the test piece so that there was no gap in an overlapped part of the test piece above the marked line (i.e., at 75 mm from the other edge of the test piece along a long side) or in an upper part of the test piece. In this manner, 20 tubes were prepared for the flame retardance test. Ten of the 20 tubes were treated under the condition (1) (23° C./50% RH/48 hours), the other ten tubes were treated (2) at 70° C. for 168 hours and then cooled for 4 hours or longer in a desiccator filled with anhydrous calcium chloride. Each of these samples was fixed upright with its upper part clamped. Then, a burner was turned on, brought close to a lower part of each of the samples, and held there for 10 seconds to ignite the sample. After 10 seconds, the burner was brought away from the sample, and the number of seconds it took for a flame or burning of each sample to be extinguished or to stop was measured.

Good (○): Under each of the conditions (1) and (2), those test pieces whose flames or burning ended up in automatic extinction within 5 seconds or at longest 10 seconds on average (of the ten test pieces) after the burner had been brought away from the test pieces
Poor (x): There was at least one test piece which was not extinguished within 10 seconds or which burned with a flame reaching the clamp in the upper part of the test piece

[Evaluation of Conductive-Layer-Integrated FPC]

<Fabrication of Evaluation Test Pieces of Conductive-Layer-Integrated FPC>

A comb-shaped pattern (line width/space width=80 μm/80 μm) was formed on a wiring-pattern-equipped film (copper foil was 12 μm, polyimide film was Apical 25NPI, manufactured by Kaneka Corporation, the copper foil is adhered with use of a polyimide adhesive), and the wiring-pattern-equipped film was dipped in 10% by volume of a sulfuric acid aqueous solution for 1 minute. The wiring-pattern-equipped film was washed with pure water, and the copper foil was subject to a surface treatment. Thereafter, the photosensitive resin composition thus prepared was flow-cast and applied onto the comb-shaped pattern on the wiring-pattern-equipped film by using a Baker's applicator and was then dried at 80° C. for 20 minutes so that the final dried film had a thickness of 25 μm. Then the photomask was placed and exposure was carried out by ultraviolet irradiation with an integral exposure amount of 300 mJ/cm². Then, an aqueous solution of 1.0 wt % of sodium carbonate was heated to 30° C. and sprayed for 60 seconds at a discharge pressure of 1.0 kgf/mm². After this development, the resultant film was sufficiently washed with pure water, and then cured for 90 minutes in an oven at 160° C. Thus the photosensitive resin composition layer (B) was fabricated.

Next, on the photosensitive resin composition layer (B) thus fabricated, a film-type conductive layer manufactured under the trade name of SF-PC5500 by Tatsuta Electric Wire 86 Cable Co., Ltd. was joined as an electromagnetic-shielding conductive layer by a thermal press at 150° C. and 2.5 MPa for 60 minutes. Thus, evaluation test pieces of conductive-layer-integrated FPC was fabricated.

(vii) Adhesion to Electromagnetic-Shielding Conductive Layer

The adhesion of the test pieces obtained in the above <Fabrication of evaluation test pieces of conductive-layer-integrated FPC> was evaluated by a cross-cut adhesion test in conformity to JIS K5400.

Good (○): Showed no peels as a result of cross-cut adhesion testing

Fair (Δ): 95% or more of the squares remained

Poor (x): Only less than 80% of the squares remained (viii) Electrical Insulation Reliability in Thickness Direction To the test pieces obtained in the above <Fabrication of evaluation test pieces>, a direct current of 20 V was applied in an environment tester set at 85° C. and 85% RH. With the direct current being applied, a change in insulation resistance, the occurrence of migration, etc. were observed.

Good (○): Showed a resistance of $10^8$ or higher 1000 hours after the start of testing, and showed no migration or dendrite.

Poor (x): Showed migration and dendrite 1000 hours after the start of testing.

TABLE 2

| Evaluation items | Ex. 1 | Ex. 2 | Ex. 3 | Ex. 4 | Ex. 5 | Ex. 6 | Comp. Ex. 1 |
| --- | --- | --- | --- | --- | --- | --- | --- |
| Photosensitivity | Good | Good | Good | Good | Good | Good | Good |
| Solvent resistance | Good | Good | Good | Good | Poor | Poor | Fair |
| Bendability | Good | Good | Good | Fair | Fair | Fair | Good |
| Solder heat resistance | Good | Good | Good | Good | Good | Good | Fair |
| Warpage (mm) | 0.5 | 1.0 | 1.0 | 5.0 | 1.0 | 1.0 | 1.0 |
| Flame retardance | Good | Good | Good | Good | Good | Good | Good |

TABLE 2-continued

| Evaluation items | Ex. 1 | Ex. 2 | Ex. 3 | Ex. 4 | Ex. 5 | Ex. 6 | Comp. Ex. 1 |
| --- | --- | --- | --- | --- | --- | --- | --- |
| Adhesion to electromagnetic-shielding material | Good | Good | Good | Good | Good | Good | Poor |
| Electrical insulation reliability | Good | Good | Good | Good | Good | Good | Poor |

INDUSTRIAL APPLICABILITY

The present invention is applicable as measures against electromagnetic noise in electronic devices such as mobile phones, video cameras, and notebook computers.

REFERENCE SIGNS LIST

1 Wiring-pattern-equipped film
2 Wiring pattern
3 Base film
4 Photosensitive resin composition layer
5 FPC
6 Electromagnetic-shielding conductive layer
7 Measurement sample
8 Receiving antenna
9 Transmitting antenna
10 Flat base
11 Amount of warpage
13 Test piece for measuring amount of warpage

The invention claimed is:

1. A conductive-layer-integrated flexible printed circuit board, comprising:
   (A) electromagnetic-shielding conductive layer;
   (B) a photosensitive resin composition layer; and
   (C) a wiring-pattern-equipped film;
   wherein the photosensitive composition layer is formed on or above the wiring-pattern-equipped film and the electromagnetic-shielding conductive layer is formed on or above the photosensitive composition layer; and
   the photosensitive resin composition layer is formed from a photosensitive resin composition containing at least (a) carboxyl-group-containing resin, (b) a photo-polymerization initiator, and (c) thermosetting resin.

2. The conductive-layer-integrated flexible printed circuit board as set forth in claim 1,
   wherein the photosensitive resin composition layer contains (d) fine particles containing at least one element selected from the group consisting of phosphorus, aluminum, and magnesium.

3. The conductive-layer-integrated flexible printed circuit board as set forth in claim 1,
   wherein (c) the thermosetting resin has at least one epoxy group.

4. The conductive-layer-integrated flexible printed circuit board as set forth in claim 3,
   wherein the number of moles of the epoxy group contained in (c) the thermosetting resin is 1.0 to 3.0 times as many as the number of moles of a carboxyl group of (a) the carboxyl-group-containing resin.

5. The conductive-layer-integrated flexible printed circuit board as set forth in claim 1,
   wherein the electromagnetic-shielding conductive layer contains (e) at least one element selected from the group consisting of silver, copper, aluminum, and nickel.

* * * * *